United States Patent
O'Neill et al.

(10) Patent No.: US 7,820,907 B2
(45) Date of Patent: Oct. 26, 2010

(54) LIQUID CRYSTALLINE INTERPENETRATING POLYMER NETWORKS

(75) Inventors: Mary O'Neill, Hull (GB); Stephen Malcolm Kelly, Beverley (GB); Miguel Angel Carrasco-Orozo, Hull (GB)

(73) Assignee: University of Hull, Great Britain (GB)

( * ) Notice: Subject to any disclaimer, the term of this patent is extended or adjusted under 35 U.S.C. 154(b) by 484 days.

(21) Appl. No.: 11/547,324

(22) PCT Filed: Apr. 1, 2005

(86) PCT No.: PCT/GB2005/001281

§ 371 (c)(1),
(2), (4) Date: Apr. 19, 2007

(87) PCT Pub. No.: WO2005/095543

PCT Pub. Date: Oct. 13, 2005

(65) Prior Publication Data

US 2007/0284556 A1     Dec. 13, 2007

(30) Foreign Application Priority Data

Apr. 3, 2004    (GB) ............................... 0407661.8

(51) Int. Cl.
*H01L 31/0224*    (2006.01)
*H01L 31/042*    (2006.01)

(52) U.S. Cl. ...................................... 136/256; 136/263

(58) Field of Classification Search ............ 252/299.01, 252/299.61, 299.62; 136/256, 263
See application file for complete search history.

(56) References Cited

U.S. PATENT DOCUMENTS

| 6,830,831 | B2 * | 12/2004 | O'Neill et al. | 428/690 |
| 6,867,243 | B2 * | 3/2005 | O'Neill et al. | 522/168 |
| 7,118,787 | B2 * | 10/2006 | O'Neill et al. | 428/1.2 |
| 2003/0018097 | A1 | 1/2003 | O'Neill et al. | |
| 2003/0021913 | A1 * | 1/2003 | O'Neill et al. | 428/1.21 |
| 2003/0027017 | A1 * | 2/2003 | O'Neill et al. | 428/690 |
| 2003/0125509 | A1 * | 7/2003 | Won et al. | 528/354 |
| 2003/0209692 | A1 * | 11/2003 | Farrand et al. | 252/299.61 |
| 2003/0235659 | A1 * | 12/2003 | Rangwalla et al. | 427/595 |

FOREIGN PATENT DOCUMENTS

| EP | 1318185 B1 | 2/2005 |
| EP | 1357163 B1 | 5/2006 |
| GB | 2379931 A | 3/2003 |
| JP | 2001-338273 | * 12/2001 |
| WO | WO 2004/093154 A3 | 10/2004 |

OTHER PUBLICATIONS

English translation by computer for JP 2001-338273,http://www4.ipdl.inpit.go.jp/Tokujitu/PAJdetail.ipdl?N0000=60&N0120=01&N2001=2&N3001=2001-338273.*
International Search Report corresponding to PCT/GB2005/001281 mailed Sep. 28, 2005.

* cited by examiner

*Primary Examiner*—Shean C Wu
(74) *Attorney, Agent, or Firm*—Myers Bigel Sibley & Sajovec, PA (57) ABSTRACT

A photovoltaic cell is provided. The photovoltaic cell can be an interconnecting liquid crystalline polymer network. Reactive mesogens of the formula B-S-A-S-B wherein A is a chromophore, S is a spacer and B is an end group susceptible to polymerization are used in the manufacture of the interconnecting liquid crystalline polymer network.

16 Claims, 4 Drawing Sheets

LIQUID CRYSTALLINE INTERPENETRATING POLYMER NETWORKS

CROSS-REFERENCE TO RELATED APPLICATIONS

This application claims priority under 35 U.S.C. §371 from PCT Application No. PCT/GB2005/001281, filed on Apr. 1, 2005, which claims priority from Great Britain Application Serial No. 0407661.8 filed on Apr. 3, 2004, the disclosures and contents of which are incorporated by reference herein in their entireties. The above-referenced PCT International Application was published in the English language as International Publication No. WO 2005/095543.

This invention relates to novel liquid crystalline blends and to uses thereof.

Liquid crystalline polymer networks are formed by the in-situ polymerisation and crosslinking of thin films of small liquid crystal molecules (reactive mesogens). Such reactive mesogens generally comprise polymerisable groups, usually at the ends of flexible aliphatic spacers, the spacer molecules being attached to a more rigid aromatic core.

Thus, for example, most modern laptop computers contain a transparent thin film made from such a liquid crystal polymer network. The liquid crystal polymer network will usually have a high birefringence which is spatially controlled to optimise the viewing angles of the liquid crystal display in the laptop and also to minimise unwanted birefringence collars.

An essential requirement of photovoltaic devices, e.g. solar cells, is that they are capable of;

(i) absorption of solar radiation and the photogeneration of electrons and holes; and (ii) charge separation and the transport of electrons and holes for collection at an anode and cathode respectively.

In an effective photovoltaic device each of these individual processes should be highly efficient and, most importantly, there should be a minimum of charge recombination. In conventionally known organic photovoltaic systems, absorption usually occurs via exciton formation. Charge separation is achieved by ionisation of the exciton to form a free electron and hole at the interface between electron-donating and electron-accepting organics. This can occur either at a single hetero-interface or, more commonly, over a distributed interface obtained by phase separation of a blend of the two organic species. The electron is trapped in the electron accepting organics and the hole is trapped in the electron donating material. The different materials are phase separated so that the separated carriers occupy different regions as they drift to the external electrodes in the built-in field introduced by dissimilar electrodes. Hence recombination is avoided and an external photocurrent and photovoltage is produced. A power efficiency of approximately 3% is among the best results to date obtained with a $C_{60}$ organic electron-acceptor dispersed in a main-chain polymer.[1]

[1] S. E. Shaheen et al. Appl. Phys. Lett., 78 841 (2001).

Two different types of main-chain polymers having different electron affinities and ionisation potentials are also commonly used. Although the performance of such devices is not yet equal to inorganic photovoltaic devices, there has been enormous improvement over the last years motivated by the intrinsic advantages of solar cells based on plastic, e.g., low cost, robustness, low toxicity, large scalability, flexibility, etc.[2]

[2] C. J. Brabec et al., Adv. Funct. Mater., 11 15 (2001).

However, the main problem with main-chain polymer blends is their reluctance to mix on the required spatial scale of about 100 Å. This requirement is due to the diffusion length of the exciton before recombination. The reluctance of main-chain polymer blends to mix greatly inhibits charge separation, which requires the exciton to encounter an interface before it can occur. This is a fundamental problem caused by the low entropy of mixing of main-chain polymers. There have been many attempts to minimise the phase separation, e.g. by controlling the solvent evaporation rate, etc. However, there remains the risk of phase separation over the lifetime of the device.

Light emitting liquid crystalline polymers are known. Thus, for example, US Patent Application No. 2003/018097 describes a process for forming a light emitting polymer wherein photopolymerisation is carried out using a reactive mesogen have an end group susceptible to a radical photopolymerisation process.

US Patent Application No. 2003/0027017 describes a light emitter for a display comprising a cinnamate or coumarin chromophore attached to a side chain polymer backbone.

We have realised a completely different and unexplored application for liquid crystalline polymer networks hereinbefore described. In particular, they are capable of producing photovoltaic films in the form of robust polymer networks at low cost, with large surface area, which are capable of converting solar radiation to electrical power.

The successful achievement has the potential for real wealth creation via an easily manufacturable, low-cost and completely new technology in the important area of renewable energy resources. Lower efficiency devices have many applications as low-cost, power supplies for consumer products.

One advantage of the novel approach of the invention is the compatibility with flexible substrates, e.g., plastic substrates. Moreover, the formation of polymer networks from blends of reactive mesogens requires completely different conditions to those required for main-chain polymer blends.

We now show why our completely novel approach presents quite different challenges and many potential advantages compared to the organic materials developed so far.

Thus, according to the invention we provide a photovoltaic cell comprising an interconnecting polymer network.

Such light absorbing networks may have a variety of utilities, but they are especially useful in the manufacture of photovoltaic cells, e.g. solar cells. Such photovoltaic cells may be reactive to light of a variety of wavelengths, e.g. ultra violet, infra-red, visible, etc.

The use of reactive mesogens allows at least four new and distinct device configurations to be devised.

The most basic configuration is suitable for use at low light levels. Electron-donating and electron-accepting reactive mesogens are intimately mixed as small molecules in the same liquid crystalline phase with no phase separation. A homogeneous crosslinked network is formed and retained by photopolymerisation or thermal polymerisation. Illumination with low light levels results in the trapping of electrons and holes by electron accepting and electron donating moieties respectively. The carriers drift/diffuse to the external electrodes. The carriers are not spatially separated so that efficiency decreases at high light levels because of the increased probability of electron and hole meeting and them recombining. It may be sufficient for one of the component of the blend to be a reactive mesogen. The second may be a main chain polymer or a small molecule.

The electron-donating and electron-accepting reactive mesogens with different polymerisable end groups, such as acrylates and conjugated dienes, are intimately mixed as small molecules in the same liquid crystalline phase with no phase separation.

Interpenetrating polymer networks are then formed either by irradiating with ultraviolet light or by thermal crosslinking. The different polymerisable end groups either polymerise at different rates or by the action of different initiators. For example, an acrylate monomer (reactive mesogen) can be crosslinked first by the action of heat to form one a gel-like polymer network containing the dispersed diene reactive mesogen. The diene monomer can then be polymerised by initiation with ultraviolet light. Hence two interpenetrating polymer networks are formed with a large surface area of contact between them, which maximises charge separation. This procedure corresponds to nanophase separation and the spatial scale of the phase separation can be controlled over length scales from tens of Ås using different photoreactive groups, irradiation conditions, temperature, etc.

A third device configuration results in a blend with completely continuous pathways from the electron-accepting material to the cathode and from the electron-donating material to the anode; no phase-separated island regions of one species, where carriers can be trapped, are formed. In this configuration, an electron-donating reactive mesogen and a non-polymerisable liquid crystal, probably but not necessarily having the same aromatic core, are deposited from solution. They are intimately mixed as small molecules in the same liquid crystalline phase with no phase separation. Irradiation of the resultant thin film with ultraviolet light crosslinks the reactive mesogen to form a gel-like network and the polymerisable and nonpolymerisable liquid crystal phase-separate on a nanometer spatial scale. The same result can be obtained by thermal polymerization. The soluble liquid crystal is removed by washing with a suitable organic solvent so that a sponge like network of the hole transporting material penetrated with nanogrooves remains. The second step is the deposition, for example by spin-coating of an electron-accepting reactive mesogen, which fills the nanogrooves forming an interpenetrating polymer network of electron-donating and electron-accepting liquid crystals. Photopolymerisation or thermal polymerisation crosslinks the electron-accepting organic and forms a completely insoluble film. This configuration can be described as a vertically segregated blend or as a bilayer photovoltaic with a distributed interface. Alternatively, a main chain polymer or an electron-accepting molecular glass can be used for the top layer.

A fourth device configuration gives an alternative approach to a vertically segregated blend. It can also be considered as a bilayer photovoltaic with a distributed interface. A thin film of the electron-donating material is deposited and partially crosslinked by thermal or photopolymerisation. Rinsing in an appropriate solvent removes some of the uncrosslinked material resulting in a nanogrooved surface with a large surface area. A distributed interface is formed when the electron-accepting material is deposited on top.

In an especially preferred aspect of the invention we provide a photovoltaic cell as hereinbefore described which is provided with a reflective coating on the rear side of the cell. Such reflective coating is suitable to reflect any transmitted light back through the cell, thus maximising the light absorption and hence the overall efficiency of the cell.

Although a variety of interconnecting polymer networks may be suitable for the photovoltaic cell of the invention, we especially prefer the use of such interconnecting polymer networks as described in, for example, the prior art of US Patent Application No. 2003/018097 which is incorporated herein by reference.

However, it should be understood that the use of the aforementioned compounds of the prior art as light absorbing liquid crystal is novel per se.

Thus, according to a preferred aspect of the invention we provide the use of a reactive mesogen of formula I in the manufacture of a light absorbing liquid crystal:

B-S-A-S-B     (general formula I)

wherein

A is a chromophore;

S is a spacer; and

B is an end group which is susceptible to polymerisation.

The polymerisation typically results in a light emitting polymer comprising arrangements of chromophores (e.g. uniaxially aligned) spaced by a crosslinked polymer backbone.

Suitable chromophore (A) groups include fluorene, vinylenephenylene, anthracene, perylene, benzothiadiazole, oxadiazole, thiophene and any derivatives thereof.

Useful chromophores are described in A. Draft, A. C. Grimsdale and A. B. Holmes, Angew. Chem. Int. Ed. Eng. [1998], 37, 402.

Suitable spacer (S) groups comprise organic chains, including e.g. flexible aliphatic, amine, ester or ether linkages. The chains may be saturated or unsaturated and be linear or branched. Aliphatic spacers are preferred. The presence of spacer groups aids the solubility and lowers the melting point of the light emitting polymer which assists the spin coating thereof.

Suitable end groups are susceptible to photopolymerisation (e.g. by a radical process using UV radiation, generally unpolarized). Preferably, the polymerisation involves cyclopolymerisation (i.e. the radical polymerisation step results in formation of a cyclic entity).

A typical polymerisation process involves exposure of a reactive mesogen of general formula I to UV radiation to form an initial radical having the general formula as shown below:

B-S-A-S-B•     (general formula II)

wherein A, S and B are as defined previously and B• is a radicalised end group which is capable of reacting with another B end group (particularly to form a cyclic entity). The B• radicalised end group suitably comprises a bound radical such that the polymerisation process may be sterically controlled.

Suitable end groups include dienes such as 1,4 1,5 and 1,6 dienes. The diene functionalities may be separated by aliphatic linkages, but other inert linkages including ether and amine linkages may also be employed.

Where the end groups are dienes the reaction typically involves cyclopolymerisation by a sequential intramolecular and intermolecular propagation: A ring structure is formed first by reaction of the free radical with the second double bond of the diene group. A double ring is obtained by the cyclopolymerisation which provides a particularly rigid backbone. The reaction is in general, sterically controlled.

An example of a suitable reactive mesogens has the general formula:

wherein R has the general formula:

and wherein
X=O, CH$_2$ or NH and preferably X=O;
S2=linear or branched alkyl or alkenyl chain optionally including a heteroatom (e.g. O, S or NH) and preferably S2=a linear alkyl chain;
Y=O, CO$_2$ or S and preferably Y=CO$_2$; and
Z=a diene (end-group) and preferably Z=a 1,4, 1,5 or 1,6 diene.

Exemplary reactive mesogens have the general formula:

wherein R is:

An exemplary reactive mesogen has the formula:

The reactive mesogen (monomer) typically has a molecular weight of from 200 to 2,000. Lower molecular weight monomers are preferred because their viscosity is also lower leading to enhanced spin coating characteristics and shorter annealing times which aids processing. The light emitting polymer network typically has a molecular weight of above 4,000, typically 4,000 to 15,000.

The light absorbing and charge-transporting polymer (network) typically comprises from 5 to 500, preferably from 10 to 300 monomeric units.

A major advantage of polymer networks is that they can be manufactured using roll-to-roll processing. The resulting cling-film like sheets are robust, portable, flexible and transferable to almost any substrate by contact bonding and essentially cheap. This presents a new development for photovoltaics. Very recently the concept of "paintable" displays based on polymer networks has been introduced[3]. This could also be applied to photovoltaic polymer networks especially for use on non-planar surfaces, such as curved surfaces.

[3] R. Peterman et al, Nature 55 417 (2002).

Most liquid crystals and virtually all liquid crystalline polymer networks are manufactured for applications in transparent liquid crystal displays. The requirements for photovoltaics are substantially different: absorption covering the visible spectrum, reasonably high electron or hole mobility and appropriate energy-level alignment. Some of these reactive mesogens absorb light in the visible spectrum. It has also been shown that the liquid crystalline state leads to higher charge mobility than amorphous organic materials.

The method of manufacturing the electron transporting reactive mesogens may be derived from, for example those described in US 2003/0018097.

We have measured the photovoltaic response of a polymer network blend formed from mixing two reactive mesogens—one for hole transport and one for electron transport. Quantum efficiencies up to 3% and open circuit voltages of 1 V have been obtained. This approach is capable of significant development and optimisation.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The present invention will now be described, by way of Example only, with reference to the accompanying Figures in which.

EXAMPLES

The following Examples utilised the compounds indicated below:

Example 1

Devices of type 1 can be made as follows.

Device processing is carried out in an oxygen and water free environment. An InSnO(anode)/coated glass slide coated with a thin film of (PEDOT/PSS) can be used as a substrate. A 2 wt % mixture of an electron-donating and an electron-accepting reactive mesogen (for example a 1:1 mixture of 1 and 2 which is nematic at room temperature) was dissolved in chloroform and transferred via a syringe onto the substrate. The substrate was spun so that a thin film of the blend is formed. The solvent was evaporated and the reactive mesogens were photopolymerised by irradiation with ultraviolet radiation until the film becomes insoluble. Light from a HeCd laser at 325 nm was used for photopolymerisation but a Mercury lamp could alternatively be used. (The absorbance of the film is compared before and after washing it in an appropriate solvent, to check that the layer is completely insoluble) A cathode, 5 Å LiF/Al, was deposited by thermal evaporation.

Figure 1:
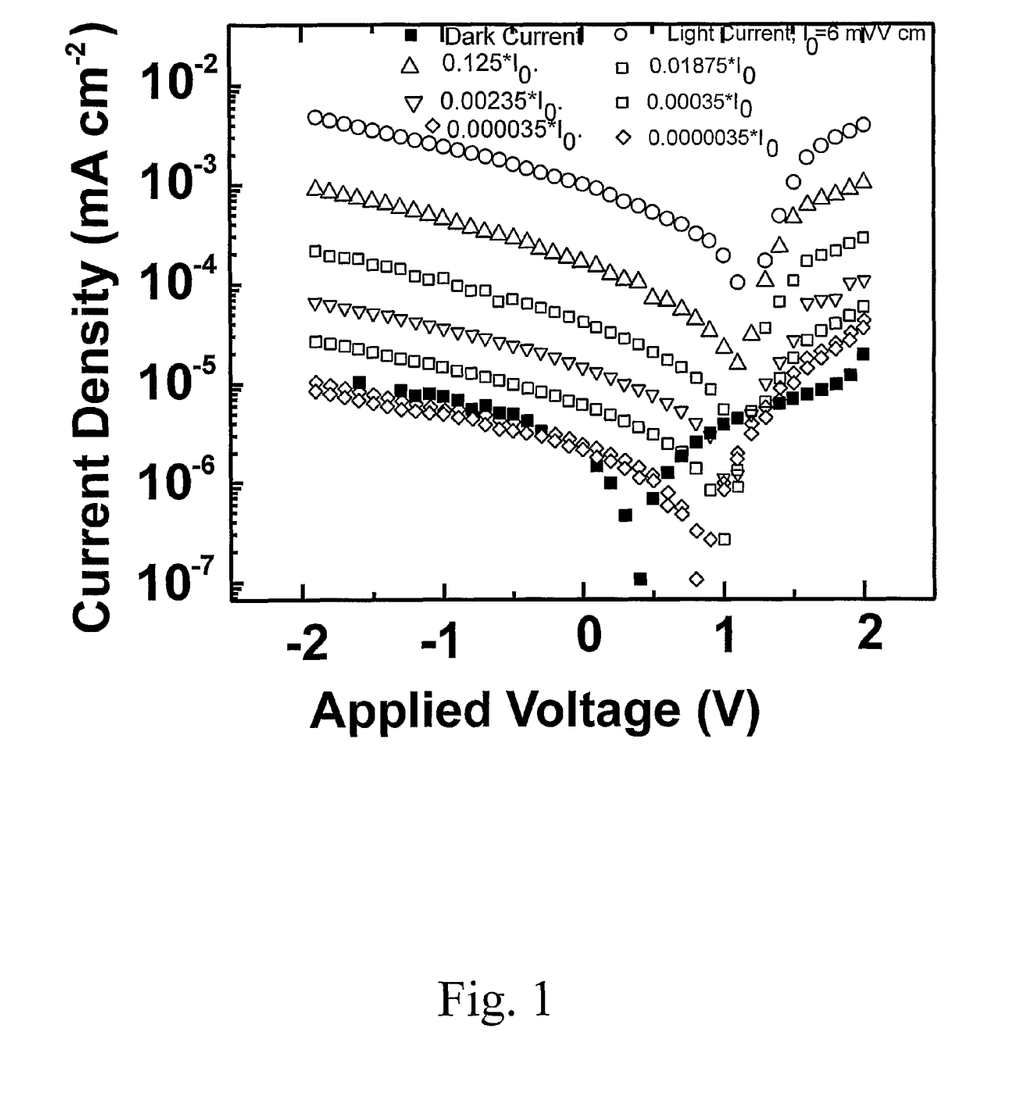
FIG. 1 shows the current versus voltage characteristics for a device of type 1 for different light intensities of monochromatic light from a Hg lamp dispersed through a monochromator.

The photovoltaic device was irradiated through the transparent substrate and anode at a wavelength(s) giving significant absorption, here 400 nm. An external quantum efficiency up to 3% and an open voltage>1V was obtained depending on the input light intensity and wavelength as illustrated by FIG. 1. All other device types can be tested in the same way.

Example 2

Devices of type 2 can be prepared as follows. Device processing is carried out in an oxygen and water free environment. An InSnO/coated glass slide coated with a thin film of (PEDOT/PSS) was used as a substrate. A 2 wt % mixture of an electron-donating and an electron-accepting reactive mesogen (for example a 1:1 mixture of 3 and 2) was dissolved in chloroform and transferred via a syringe onto the substrate. The substrate was spun so that a thin film of the blend is formed. The solvent was then evaporated. Compound 3 was thermally polymerised by heating at 80° C. for 30 minutes. On cooling 2 was photopolymerised by irradiation with ultraviolet radiation until the film becomes incompletely insoluble. A cathode, 5 Å LiF/Al was deposited by thermal evaporation.

Example 3

Devices of type 3 can be prepared as follows. Device processing was carried out in an oxygen and water free environment. An InSnO/coated glass slide coated with a thin film of (PEDOT/PSS) was used as a substrate. A light-emitting gel was prepared by the polymerisation of a 1 wt % mixture of the non-polymerisable nematic compound 4 and the crosslinkable reactive mesogen 1 in the ratio 1:3. Both compounds are electron donating.

Figure 2:
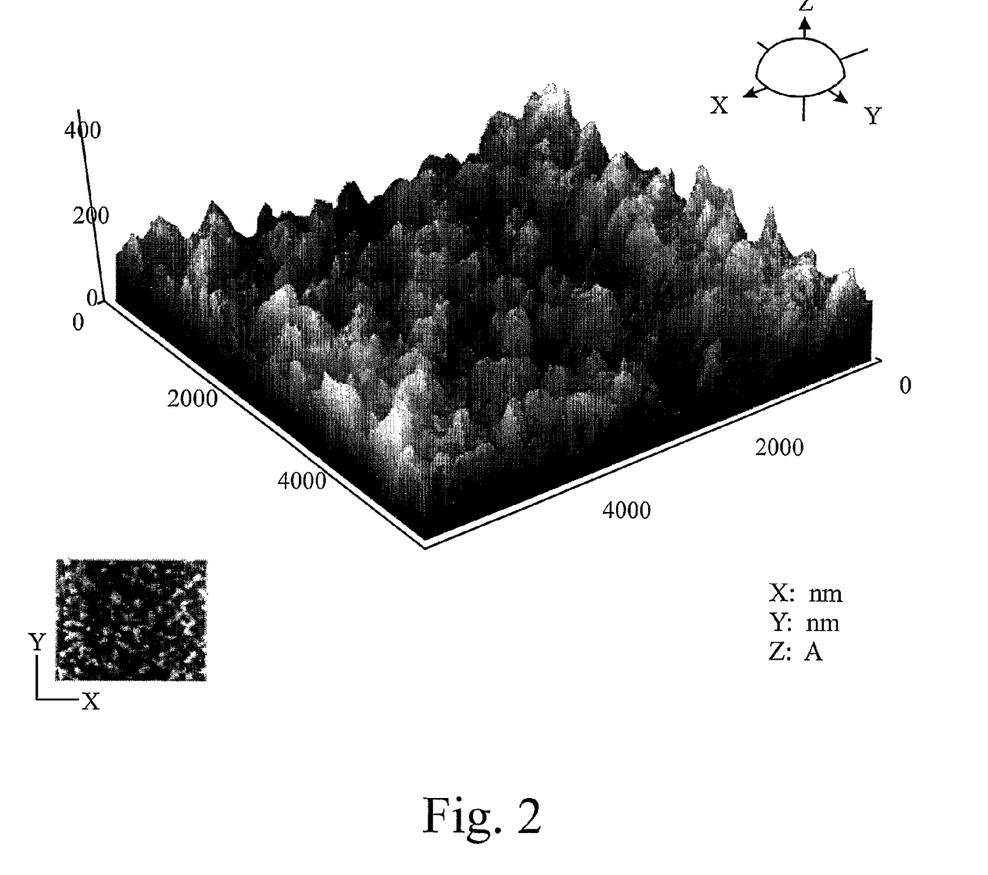
FIG. 2 shows an AFM image of nanogrooves formed after removal of nonpolymerisable component 4 from surface of phase separated LC gel.

The gel was heated to 60° C. and photopolymerised using light from a HeCd laser at 325 nm. The irradiation conditions for photopolymerisation depends on the UV light source and intensity. The gel was washed to remove the nonpolymerisable component from the surface of the gel and form a sponge-like network. Atomic force microscopy was used to image the sponge-like surface topography of the network on removal of the nonpolymerisable component. The image is shown in FIG. 2 The spatial scale of the network can be modified by varying the polymerisation rate and the temperature at which photopolymerisation occurs.

Figure 3:
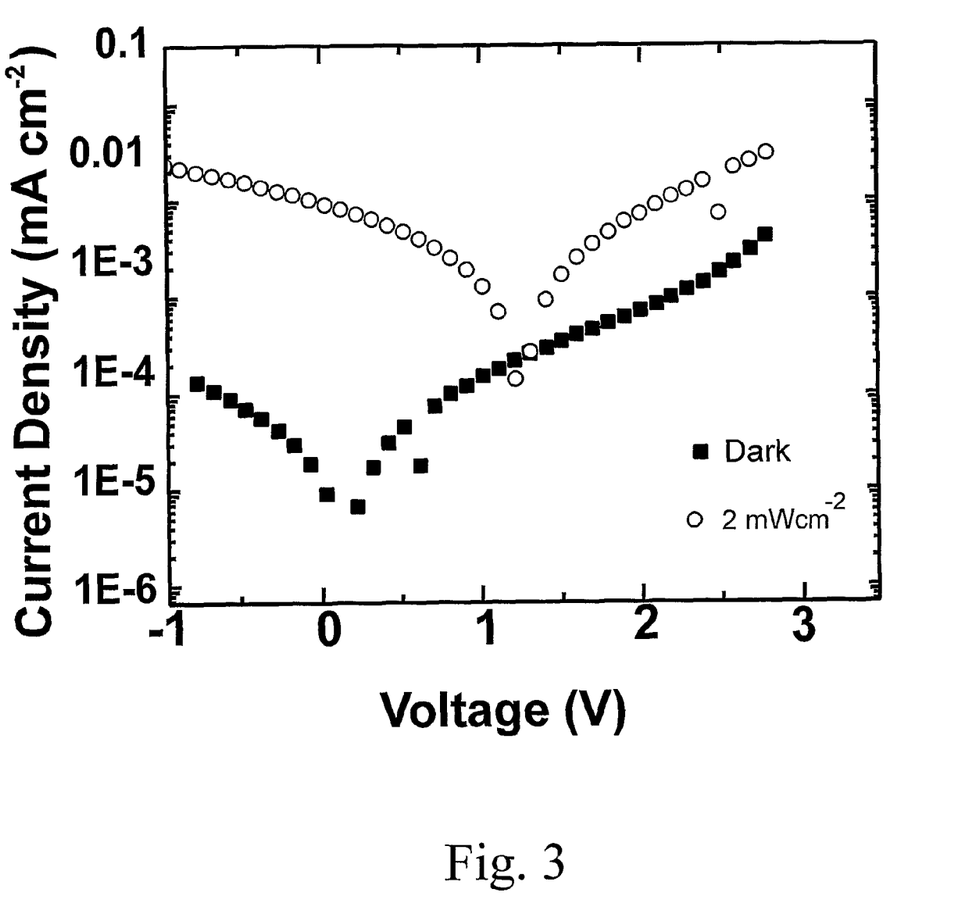
FIG. 3 shows the current-voltage characteristics of the photovoltaic device in the dark and on irradiation with light of intensity 2 mW cm$^{-2}$ and wavelength 400 nm.

An electron accepting material $AlQ_3$, which is a small molecular glass, of thickness approximately 30 nm, was deposited on top by thermal evaporation and a cathode deposited as above. FIG. 3 shows the current-voltage characteristics of the photovoltaic device in the dark and on irradiation with light of intensity 2 mW cm$^{-2}$ and wavelength 400 nm. A power conversion efficiency of 0.1% was obtained.

Example 4

Figure 4:
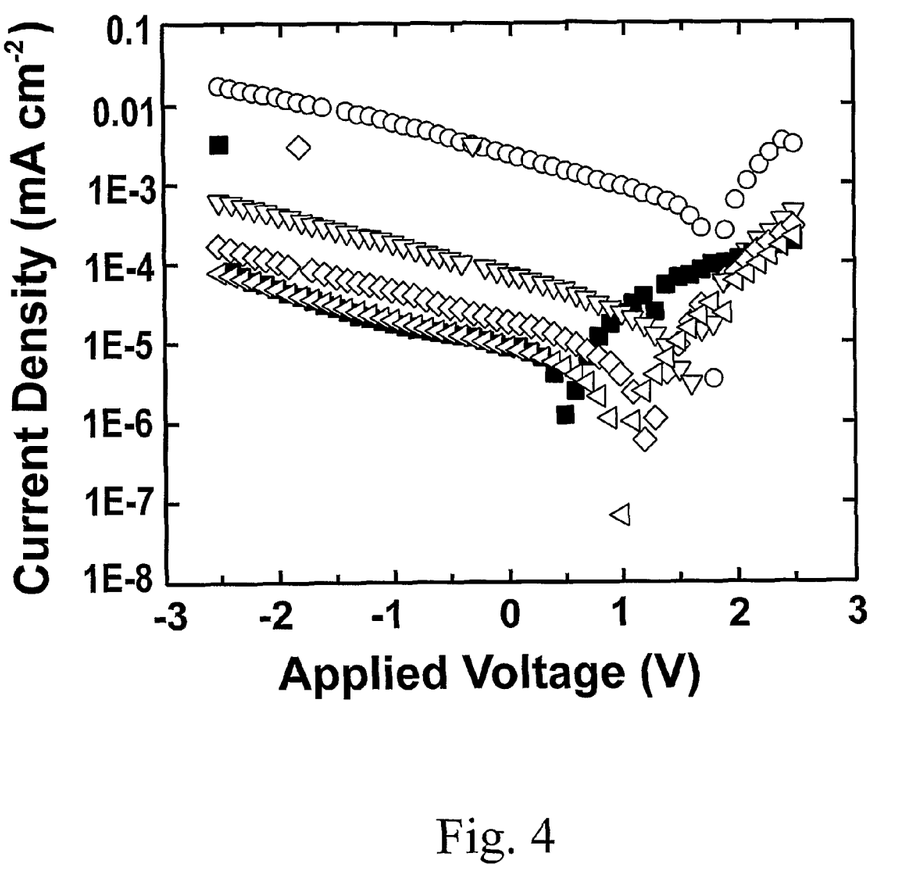
FIG. 4 shows the current-voltage characteristics of device type 4 in dark (Black squares) and on irradiation with light of wavelength 400 nm and different intensities.

Devices of type 4 can be prepared as follows. Device processing was carried out in an oxygen and water free environment. An InSnO/coated glass slide coated with a thin film of (PEDOT/PSS) was used as a substrate. A 1 wt % mixture of the electron-donating reactive mesogen 1 was dissolved in chloroform and transferred via a syringe onto the substrate. The substrate was spun so that a thin film of the blend is formed. The solvent was evaporated and the reactive mesogen was photopolymerised by irradiation with ultraviolet radiation until the film is almost insoluble. (Typically, we used about ⅚ times the ultraviolet fluence required to obtain a completely insoluble layer.) The irradiation conditions for photopolymerisation depends on the UV light source and intensity. The film was washed to remove some of the unpolymerised monomer from the surface of the film Atomic force microscopy can be used to check the spatial scale of the nanogrooves formed, which can be modified by varying the polymerisation rate. An electron accepting material, was deposited on top by spin-casting from a 1 wt % of solution 2 dissolved in chloroform and transferred via a syringe onto the gel. 2 was photopolymerised A cathode, for example 5 Å LiF/Al is deposited by thermal evaporation as a cathode. FIG. 4 shows the current-voltage characteristic for different light intensities up to 1 mW cm$^{-2}$. An external quantum efficiency of 0.8% and a power conversion efficiency of 0.2% was obtained at 1 mW cm$^{-2}$.

The invention claimed is:

1. A photovoltaic cell containing a photovoltaic film comprising an interpenetrating liquid crystal polymer network comprising phase separated regions of electron donating and electron accepting materials, with at least one component a reactive mesogen.

2. A photovoltaic cell according to claim 1 wherein the cell contains light-absorbing, electron-donating and electron-accepting components at least one component of which is a polymer network.

3. A photovoltaic cell according to claim 2 wherein the electron-donating and/or electron-accepting polymer network is formed by polymerisation of individual reactive mesogens or mixtures of reactive mesogens.

4. A photovoltaic cell according to claim 1 wherein the cell containing a polymer network formed by polymerisation of a blend of electron-donating and electron-accepting components to form an interpenetrating polymer network.

5. A photovoltaic cell according to claim 1 wherein the cell contains a polymer network formed by sequential and separate polymerisation of electron-donating and electron-accepting monomer components of a blend.

6. A photovoltaic cell according to claim 5 wherein the components are reactive mesogens.

7. A photovoltaic cell according to claim 1 wherein the cell contains a polymer network formed by the polymerisation of electron-donating and electron-accepting monomer components of a blend at different rates.

8. A photovoltaic cell according to claim 7 wherein the components are reactive mesogens.

9. A photovoltaic cell according to claim 1 wherein the cell contains a polymer network formed by sequential formation of a gel, followed by removal of the non-polymerisable component and its replacement by another component.

10. A photovoltaic cell according to claim 9 wherein the components are reactive mesogens and the replacement component is polymerised to form a second polymer network.

11. A photovoltaic cell according to claim 1 wherein the cell contains a polymer network formed by sequential formation of a partially crosslinked polymer network, followed by removal of the non-polymerised monomers and it's replacement by another component.

12. A photovoltaic cell according to claim 11 wherein the components are reactive mesogens and the replacement component is polymerised to form a second polymer network.

13. A photovoltaic cell according to claim 1 wherein the polymer networks are manufactured as sheets or tiles that are contact bonded to a substrate.

14. A photovoltaic cell according to claim 1 wherein the polymer networks are applied to non-planar surfaces by simple coating techniques.

15. A photovoltaic cell comprising a interpenetrating polymer network formed from a mixture of reactive mesogens of general formula I:

B-S-A-S-B          (general formula I)

wherein

A is a chromophore;

S is a spacer; and

B is an end group which is susceptible to polymerisation.

16. The photovoltaic cell according to claim 15, wherein the end group B is susceptible to polymerization through thermal or photopolymerisation.

\* \* \* \* \*